(12) United States Patent
Dohnke et al.

(10) Patent No.: US 7,071,503 B2
(45) Date of Patent: Jul. 4, 2006

(54) SEMICONDUCTOR STRUCTURE WITH A SWITCH ELEMENT AND AN EDGE ELEMENT

(75) Inventors: Karl Dohnke, Memmelsdorf (DE); Rudolf Elpelt, Erlangen (DE); Peter Friedrichs, Nürnberg (DE); Heinz Mitlehner, Uttenreuth (DE); Reinhold Schörner, Grossenseebach (DE)

(73) Assignee: SiCED Electronics Development GmbH & Co. KG, Erlangen (DE)

( * ) Notice: Subject to any disclaimer, the term of this patent is extended or adjusted under 35 U.S.C. 154(b) by 0 days.

(21) Appl. No.: 10/950,027

(22) Filed: Sep. 24, 2004

(65) Prior Publication Data

US 2005/0062112 A1    Mar. 24, 2005

Related U.S. Application Data

(63) Continuation of application No. PCT/DE03/00790, filed on Mar. 12, 2003.

(30) Foreign Application Priority Data

Mar. 26, 2002 (DE) .................. 102 13 534

(51) Int. Cl.
    *H01L 29/80* (2006.01)
(52) U.S. Cl. .................. 257/256; 257/287
(58) Field of Classification Search ............. 257/256, 257/263, 266, 287, 77
    See application file for complete search history.

(56) References Cited

U.S. PATENT DOCUMENTS

| | | | |
|---|---|---|---|
| 5,712,502 A | 1/1998 | Mitlehner et al. | |
| 6,034,385 A | 3/2000 | Stephani et al. | |
| 6,157,049 A | 12/2000 | Mitlehner et al. | |
| 6,188,555 B1 | 2/2001 | Mitlehner et al. | |
| 6,232,625 B1 | 5/2001 | Bartsch et al. | |
| 6,459,108 B1 | 10/2002 | Bartsch et al. | |
| 6,693,322 B1 | 2/2004 | Friedrichs et al. | |
| 2003/0137010 A1 | 7/2003 | Friedrichs et al. | |
| 2005/0062112 A1* | 3/2005 | Dohnke et al. ............ | 257/409 |

FOREIGN PATENT DOCUMENTS

| | | |
|---|---|---|
| DE | 196 31 872 A1 | 2/1998 |
| EP | 0 772 889 B1 | 5/1997 |
| JP | 63007670 A | 1/1988 |
| WO | 96/03774 | 2/1996 |
| WO | 97/23911 | 7/1997 |
| WO | 98/49733 | 11/1998 |
| WO | 98/59377 | 12/1998 |

(Continued)

*Primary Examiner*—Mark V. Prenty
(74) *Attorney, Agent, or Firm*—Laurence A. Greenberg; Werner H. Stemer; Ralph E. Locher

(57) ABSTRACT

A semi-conductor structure for controlling and switching a current has a switch element and an edge element. The switch element contains a first semi-conductor area of a first conductivity type contacted by way of an anode electrode and a cathode electrode, a depletion area that is arranged inside the first semi-conductor area and that can be influenced by a control voltage applied to the control electrode for the purpose of current control, and an island area of a second conductivity type that is buried inside the first semi-conductor area. The edge element contains an edge area of the second conductivity type that is buried inside the first semi-conductive area and that is formed on a common level with the buried island area, in addition to an edge terminating area of a second conductivity type adjacent the edge area.

19 Claims, 4 Drawing Sheets

FOREIGN PATENT DOCUMENTS

WO 00/16403 3/2000
WO 02/09195 A1 1/2002

\* cited by examiner

US 7,071,503 B2

SEMICONDUCTOR STRUCTURE WITH A SWITCH ELEMENT AND AN EDGE ELEMENT

CROSS-REFERENCE TO RELATED APPLICATION

This is a continuing application, under 35 U.S.C. § 120, of copending international application No. PCT/DE03/00790, filed Mar. 12, 2003, which designated the United States; this application also claims the priority, under 35 U.S.C. § 119, of German patent application No. 102 13 534.7, filed Mar. 26, 2002; the prior applications are herewith incorporated by reference in their entirety.

BACKGROUND OF THE INVENTION

Field of the Invention

The invention relates to a semiconductor structure intended for controlling and switching a current, which comprises at least one switch element with a first semiconductor area of a first conductivity type, which is contacted by means of an anode electrode and a cathode electrode and within which a path extends for the current, with a first depletion zone, arranged at least partially within the first semiconductor area, which can be influenced by means of a control voltage present at a control electrode for the purpose of controlling the current, and with an island area, contacted by means of the cathode electrode, buried at least partially within the first semiconductor area, of a second conductivity type which is opposite to the first conductivity type. A semiconductor structure of this type is described in international PCT publication WO 00/16403 A1.

To supply an electrical load with a nominal electric current, the load is usually connected to an electrical supply system via a switching device. During the switching-on process and also in the case of a short circuit, an overcurrent may occur which is clearly above the nominal current. To protect the electrical load, the switching device connected between the load and the electrical system must be able to limit and also switch off this overcurrent. Furthermore, there are applications, for example in the inverter technology, in which the load must also be reliably isolated from the supply system in the case of a voltage present in the reverse direction. For the functions described, current-limiting switches in the form of a semiconductor structure are known.

Thus, a semiconductor structure in which a current flowing between an anode and cathode electrode on a current path through the semiconductor structure is controlled, is described in each case in the above-mentioned WO 00/16403 A1 and also in international PCT publication WO 02/09195 A1, corresponding to U.S. Pat. No. 6,693,322 B2 (US 2003/0137010 A1).

In particular, the current can be switched on and off, or limited to a maximum value. The active part of the semiconductor structure consists of a first semiconductor area of a predetermined conductivity type, particularly of the n-conductivity type. The conductivity type is determined by the type of charge carriers with which the semiconductor area is doped. For controlling and influencing the current, at least one lateral channel area, arranged in the current path, is provided within the first semiconductor area. Lateral or also horizontal is understood here to be a direction parallel to a major surface of the first semiconductor area. Vertical, in contrast, is a direction extending perpendicularly to the major surface. The lateral channel area is limited in the vertical direction by at least one p-n junction, particularly by the depletion zone (zone with depletion of charge carriers and thus high electrical resistance; space charge zone) of this p-n junction. The vertical extent of this depletion zone can be adjusted, among other things, by a control voltage. The p-n junction is formed between the first semiconductor area and a second p-type area. A second p-n junction limiting the lateral channel area in the vertical direction is formed between the first semiconductor area and a buried island area.

The known semiconductor structure basically has a high reverse-voltage strength. This applies, in particular, if silicon carbide (SiC) is used as semiconductor material. At the edge of the semiconductor structure, however, an excessive increase in the electrical surface field can occur which reduces the reverse-voltage strength.

To reduce such a critical surface field, a so-called JTE (junction termination extension) edge termination or use in a semiconductor structure implemented, in particular, in SiC is described in European patent EP 0 772 889 B1 and corresponding U.S. Pat. No. 5,712,502.

Such a JTE edge termination is based on a controlled addition of charges of the second charge type into the surface of the first semiconductor area provided as drift area. In particular, lower doping than in the remaining areas of the second conductivity type is provided in this case. Due to the JTE edge termination, the electrical field is widened at the surface and the field curvature is reduced so that the reverse-voltage strength of the semiconductor structure is increased. In detail, EP 0 772 889 B1 and U.S. Pat. No. 5,712,502 describe the formation of a JTE edge termination for a p-n diode and a MOSFET. However, no actual information on the implementation of the JTE edge termination is provided for other component forms of the semiconductor structure.

In particular, actual information is also missing for the various embodiments of a high-voltage switch element used in a so-called cascode circuit. The cascode circuit is known, for example, from U.S. Pat. No. 6,157,049. The electronic switch device disclosed therein is based on a special interconnection of a low-voltage switch element and the high-voltage switch element. The switch device is used for switching a high electrical current and is also capable of reliably blocking a high operating voltage. The low-voltage switch element, a normally-off MOSFET consists, in particular, of silicon (Si) and ensures that the interconnection with the high-voltage switch element, constructed as normally-on JFET also results in a normally-off unit overall. The high-voltage switch element consists of a semiconductor material with a breakdown field strength of more than $10^6$ V/cm, for example also of SiC. In the reverse-voltage case, it then absorbs the major part of the voltage present at the cascode circuit and to be blocked.

Furthermore, from German patent application DE 196 31 872 A1, there is known a vertical semiconductor component with a semiconductor body that has at least one active semiconductor material contact in which there are island areas of different doping which are buried in the semiconductor area. There is no contacting of the island areas.

Furthermore, from international PCT publication WO 98/59377 A1 corresponding to U.S. Pat. No. 6,188,555, U.S. Pat, No. 6,232,625 B1, and U.S. Pat. No. 6,459,108 B1, there is known a semiconductor current limiter with positive temperature coefficient layers of different doping, a lateral channel area and a lateral island area exists in which, when a predetermined saturation current is exceeded, the lateral channel area is pinched off and the current is limited to a value below the saturation current. Here, too, there is no electrical connection. Finally, from WO 96/03774 A1 corresponding to U.S. Pat. No. 5,712,502, a semiconductor component with highly blocking edge termination is known in which the depletion zone of an active area is accommodated with a vertical extent depending on an applied reverse voltage.

SUMMARY OF THE INVENTION

It is accordingly an object of the invention to provide a semiconductor structure with a switch element and an edge element which overcomes the above-mentioned disadvantages of the heretofore-known devices and methods of this general type and which has a high reverse-voltage strength and thus better effectiveness than in the prior art.

With the foregoing and other objects in view there is provided, in accordance with the invention, a semiconductor structure for controlling and switching a current, comprising:

a) a switch element with:
   a1) a first semiconductor area of a first conductivity type defining therein a path for the current, an anode electrode and a cathode electrode in contact with said first semiconductor area;
   a2) a first depletion zone formed at least partially within said first semiconductor area, and a control electrode disposed to influence said first depletion zone by way of a control voltage for the purpose of controlling the current; and
   a3) an island area of a second conductivity type opposite the first conductivity type, said island area being at least partially buried within said first semiconductor area and contacted by way of said cathode electrode;
b) an edge element with:
   b1) an edge area of the second conductivity type buried at least partially within said first semiconductor area and disposed substantially at a same level as said buried island area; and
   b2) an edge termination area of the second conductivity type, adjoining said edge area; and
   b3) an electrically conductive connection between said control electrode and said edge area.

In other words, the semiconductor structure according to the invention for controlling a current is a semiconductor structure of the type initially mentioned which also comprises an edge element comprising an edge area buried at least partially within the first semiconductor area, of the second conductivity type which is arranged at the same level as the buried island area, and an edge termination area of the second conductivity type adjoining the edge area and in which an electrically conducting connection exists between the control electrode and the edge area.

The invention is based on the finding that it is advantageous if the edge area is located in one level with the buried island area of the switch element. Such an arrangement at the same level makes it possible to avoid unwanted excessive field increases at the corner, facing the edge element, of the buried island area which is part of the switch element adjoining the edge element, in the reverse-voltage case. In the switch element, the island area is used, in particular, for shielding the cathode electrode. The arrangement of island and edge area at the same level leads to a reduced curvature of the potential line so that the semiconductor structure exhibits a reverse-voltage strength which is increased by about 30% with otherwise the same doping and thickness.

It is also advantageous in this respect that the edge termination area of the second conductivity type adjoins the edge area. In particular, the edge termination area is located at the side of the edge area facing away from the switch element. The edge termination area is preferably less doped than the edge area. Thus, a JTE edge termination is formed. In particular, the edge area and the edge termination area are in one plane with the buried island area of the switch element. A variant which is just as conceivable and may at first glance even appear to be simpler, in which the edge termination area is arranged at the same level as the first depletion zone, which can be influenced by the control electrode, would not suppress the named excessive field increase at the island area of the adjacent switch element, or only less well. The edge termination area adjoining the edge area, in contrast, leads to a distinct reduction in the critical curvature of the potential line on the corner of the buried island area so that a further improved reverse-voltage strength of the edge element occurs.

A further advantage consists in that the field strength values occurring in the reverse-voltage case in the edge element and also in the boundary area of the adjoining switch element are considerably reduced.

Thus, the semiconductor structure has in the edge element an approximately comparably high reverse-voltage strength as in the volume of the switch elements which, in particular, are present in large numbers. In the case of a reverse voltage, any avalanche breakdown occurring will only occur at a higher reverse voltage, on the one hand, and on the other hand, preferably in the area of the edge element not as in a conventional edge element which exhibits a worse reverse-voltage strength. Instead, the probability of an avalanche breakdown is then distributed approximately equally over the entire area of the semiconductor structure. This relieves the control circuit which is usually dimensioned for no current flow at all or only for a very small current flow. This is because the high current generated during an avalanche breakdown largely flows in the load circuit which is designed for a high current value, in any case.

The electrically conductive connection between the control electrode and the edge area also provides advantages. This connection can be produced, in particular, by a separate connecting area arranged within the first semiconductor area or also by the control electrode in direct resistive contact with the edge area. In the latter case, the metallization of the control electrode extends to a part of the surface of the edge area which has been exposed, if necessary. A switch element with an edge element in which the edge area is connected to the control electrode can be preferably used in a cascode circuit. In contrast to the known edge termination for the MOSFET, in which an area comparable to the edge area is connected to the source electrode (corresponding to the cathode electrode), a connection of the edge area to the control electrode is more advantageous. This is because its use in a cascode circuit leads to the control electrode of the semiconductor structure, which acts as a high-voltage switch element, being electrically connected to one of the two main connections of the cascode circuit and thus is also connected to the full reverse potential in the reverse-voltage case.

In accordance with a further embodiment with, in particular, a lateral channel area, which is arranged within the first semiconductor area and through which the current path extends. Within this channel area, the current flow can then be influenced in a very simple manner by means of at least one of the two depletion zones. This is done, for example, via a control change of the local extent of the depletion zone. This provides the desired control of the current carrying capability in the channel area and also of the current flow between anode and cathode electrode. In this connection it is also advantageous if the first depletion zone and the buried island area of the switch element overlap in a common plane at their lateral edges in a fictitious projection performed perpendicularly to one surface of the first semiconductor area. The lateral channel area then extends just in the area of this overlap.

In a further variant, the first depletion zone which, in particular, limits the lateral channel area in the vertical direction, is the depletion zone of a p-n junction which is located between the first semiconductor area and a second semiconductor area. The second semiconductor area is arranged at a surface within the first semiconductor area. It has the opposite conductivity type compared with the conductivity type of the first semiconductor area and is in resistive contact with the control electrode. The extent of the first depletion zone, and thus the electrical resistance of the lateral channel area, can be controlled by applying a control voltage to this control electrode. In principle, the first depletion zone, the extent of which can be varied, can also be implemented in another form, for example by means of a MIS (metal insulator semiconductor) contact or a Schottky contact. These embodiments are described in the above-identified publication WO 00/16403 A1 and also in WO 02/09195 A1 and U.S. Pat. No. 6,693,322 B2.

The first depletion zone is preferably disposed above the buried island area, i.e. the first depletion zone extends in a plane or, rather, in a layer of the semiconductor structure which is above that of the buried island area. In the boundary area between the edge element and the adjacent switch element, the first depletion zone is then also located above the edge area in this sense. The first depletion zone and the island area and edge area can be arranged laterally offset with respect to one another and, in particular, can also have different lateral dimensions.

Preferably, a number of particularly similar and mutually parallel-connected switch elements are provided. They are arranged laterally next to one another resulting in a cell design. In this manner, the current carrying capability of the semiconductor structure can be increased. In addition, a high packing density is achieved by this means and thus good utilization of the semiconductor area. A contact arrangement which is then particularly advantageous provides for a particularly fast switch-over of the switch elements.

An advantageous effect with respect to the reverse-voltage strength proves if the distances between adjacent switch elements, and particularly, between the buried island areas of adjacent switch elements are in each case approximately of equal size. A typical distance value is about 5 μm. However, another distance measure is also possible. The distance measure being maintained approximately ensures that the potential lines extend as uniformly as possible in the volume of the semiconductor structure. In particular, an excessive field increase due to a potential line with greater curvature, which could occur in the case of greatly fluctuating distances between the island areas on the corners or lateral edges of the island areas is avoided. The uniform distance measure of the switching elements between one another should preferably also be observed in the edge area. In particular, it is advantageous if the distance between the buried island area of the switch element adjoining the edge element and the edge area of the edge element is at a maximum equal to the uniform distance measure between the switch elements. This edge distance is preferably smaller than the uniform distance measure between the switch elements. This also prevents an unwanted excessive field increase at this point. Thus, the pitch of the cell design should be maintained as accurately as possible, especially with a view to a good reverse-voltage capability—at the edge but also in the volume.

The semiconductor structure preferably contains a control contact element which provides a large-area connecting capability for an external control feedline to the interconnected control electrodes of the switch element. The control contact element is arranged between two switch elements. To provide for contact, in particular, it is larger than one switch element.

The control contact element can also contain at least one buried island area of the second conductivity type. The latter is arranged, in particular, at the same level as the buried island areas of the switch elements. The buried island areas of the control contact element are preferably not electrically connected to those of the switch elements. Instead, they are designed to float. Thus, there is a similar or even the same field distribution without unwanted field spikes as in the remaining semiconductor structure also in the area of the control contact element. This is also promoted by the fact that the buried island areas of the control contact elements also have the uniform distance predetermined by the pitch between one another and to those of the adjoining switch elements.

For connecting the external control feedline, the control contact element also contains a particularly large-area control contact area of the second conductivity type provided with a metallization. It can be arranged above the buried island areas of the control contact element or also coincide with the latter. In the latter case, this provides a lowered control electrode connection produced, for example, by means of etching. At its lateral edge, the uniform distance to the buried island areas of the adjacent switch elements is again maintained.

In another variant, a removal of material of the first semiconductor area in the region of the edge element is also provided for contacting the buried edge area so that the edge area is at least partially exposed. In a recess thus formed, the edge area is contacted by means of the control electrode. A lateral edge of the recess adjoining the first semiconductor area is provided with an insulation arranged in particular between the contact metallization of the control electrode and the first semiconductor area. This makes it possible to avoid a leakage current between the cathode electrode and the control electrode. Various embodiments are conceivable as insulation. For example, a connection area of the second conductivity type can extend along the lateral edge of the recess within the first semiconductor area. As an alternative, an oxide layer or a special choice of the contact metal is also possible so that a Schottky contact is formed on the first semiconductor area exhibiting the first conductivity type.

In an advantageous embodiment, the semiconductor structure consists partially or also completely of a semiconductor material which has an energy gap of at least 2 eV. Suitable semiconductor materials are, for example, diamond, gallium nitride (GaN) indium phosphide (InP) or preferably silicon carbide (SiC). Due to the extremely low intrinsic charge carrier concentration caused by the high energy gap (charge carrier concentration without doping), the above semiconductor materials are very advantageous, particularly SiC. In comparison with the "universal semiconductor" silicon, the above semiconductor materials have a distinctly higher breakdown strength, so that the semiconductor structure has a very low forward loss even with a higher reverse voltage. The preferred semiconductor material is silicon carbide, particularly monocrystalline silicon carbide of the 3C or 4H or 6H or 15R polytype.

Other features which are considered as characteristic for the invention are set forth in the appended claims.

Although the invention is illustrated and described herein as embodied in a semiconductor structure with a switch element and edge element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
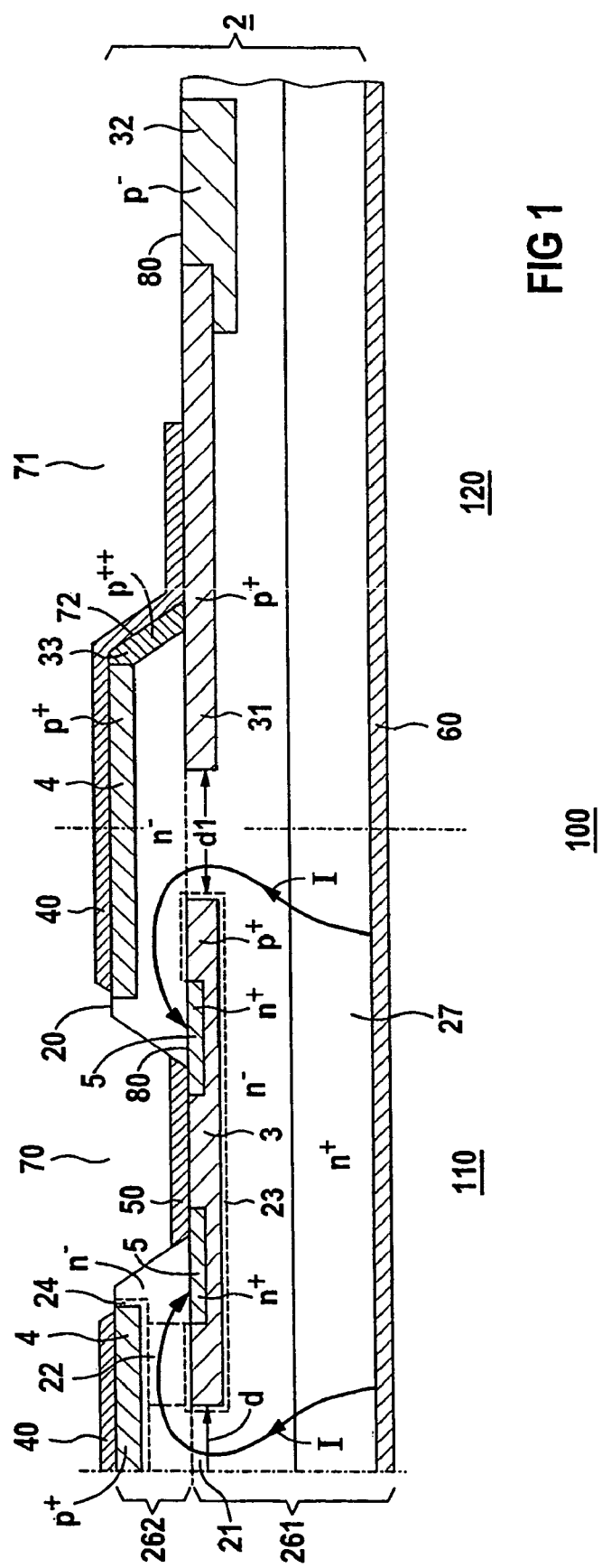
FIG. 1 is a partial sectional side view of a semiconductor structure with a switch element and an edge element.

Referring now to the figures of the drawing in detail and first, particularly, to FIG. 1 thereof, there is shown a semiconductor structure 100 with a switch element 110 for controlling a current I and with an edge element 120.

First, the structure and the operation of the switch element 110, implemented as a vertical junction field effect transistor (JFET), will be described. The switch element 110 shown in FIG. 1 represents a single cell which can be expanded into a multi-cell structure by multiple reflection at the left cell edge.

The active part, in which the current is essentially controlled, is contained in an n-type (electron conduction) first semiconductor area 2. Within the first semiconductor area 2, there is disposed a preferably implanted p-type (hole conduction) buried island area 3. The first semiconductor area 2 has a first surface 20, the buried island area 3 has a second surface 80. Both surfaces 20 and 80 are essentially parallel to one another. In the exemplary embodiment of FIG. 1, the first semiconductor area 2 is composed of a semiconductor substrate 27 and two epitaxially grown-on semiconductor layers 261 and 262 arranged on this substrate. The first surface 20 belongs to the second epitaxial layer 262 and the second surface 80 belongs to the first epitaxial layer 261. The two epitaxial layers 261 and 262 essentially have the same basic doping. They have lower doping ($n^-$) than the semiconductor substrate 27 ($n^+$).

An n-type cathode contact area 5 embedded within the island area 3 is provided on the second surface 80. It is highly doped ($n^+$) and also produced, in particular, by way of implantation. The island area 3 extends farther than the cathode contact area 5 parallel to the first surface 20 in all directions.

The semiconductor material used in the semiconductor structure 100 is silicon carbide (SiC). It is particularly well suited due to its specific material characteristics, particularly with high voltages. Preferred dopants are boron and aluminum for p-type doping and nitrogen and phosphorus for n-type doping. The dopant concentration of the cathode contact area 5 is typically between $1 \times 10^{19}$ cm$^{-3}$ and $1 \times 10^{20}$ cm$^{-3}$ and that of the two epitaxial layers 261 and 262 is typically $5 \times 10^{16}$ cm$^{-3}$ at a maximum (The symbol "×" is here used as a multiplication symbol). The doping of the first epitaxial layer 261 depends, in particular, on the reverse voltage to be absorbed by the semiconductor structure 100 in the case of a reverse voltage. The higher the reverse voltage the lower this doping is. The epitaxial layer 261 essentially has to carry the electrical field to be blocked. In the example shown, both epitaxial layers 261 and 262 have a bulk doping of about between $5 \times 10^{15}$ cm$^{-3}$ and $7 \times 10^{15}$ cm$^{-3}$. The reverse voltage is then at least 1200 V.

Within the second epitaxial layer 262, a contact hole 70 produced, for example, by means of a dry etching process, is provided which extends up to the second surface 80 in the vertical direction. The contact hole 70 exposes both a part of the buried island area 3 and a part of the cathode contact area 5 so that both areas 3 and 5 can be contacted resistively from an electrically conductive material by means of a cathode electrode 50. The cathode contact area 5 and the island area 3 are short circuited by the cathode electrode 50. The material which can be used for the cathode electrode 50 is polysilicon or a metal, preferably nickel, aluminum, tantalum, titanium or tungsten.

On a side of the first semiconductor area 2 facing away from the first surface 20, an anode electrode 60 is provided. The current I flowing through the semiconductor structure 100 is supplied and removed by means of the two electrodes 50 and 60. Due to the essentially vertical current path, which extends perpendicularly to the first surface 20, the semiconductor structure 100 is also called vertical.

Laterally next to the contact hole 70, a second semiconductor area 4 is arranged within the first semiconductor area 2 on the first surface 20. It is a p-type, particularly a strong p-type ($p^+$) and preferably created by means of ion implantation. Between the first semiconductor area 2 and the second semiconductor area 4 is a p-n junction with a first depletion zone 24 which essentially extends into the first semiconductor area 2. A further p-n junction with a second depletion zone 23 exists between the first semiconductor area 2 and the buried island area 3. The second depletion zone 23 surrounds the entire buried island area 3. To the extent to which the two depletion zones 23 and 24 extend into the first semiconductor area 2, they are drawn dashed in FIG. 1. The first and the second depletion zone 24 and 23, respectively, delimit in the vertical direction a lateral channel area 22 which is located within the first semiconductor area 2 and is a part of the current path between the two electrodes 50 and 60, respectively. The first depletion zone 24 and the buried island area 3 are arranged in such a manner that the two depletion zones 23 and 24 overlap at their lateral edges in a projection onto the first surface 20. The lateral channel area 22 is located just inside this area of overlap.

The main current path between the cathode and anode electrode 50 and 60, respectively, also comprises, apart from the lateral channel area 22 and the cathode contact area 5, a further vertical channel area 21, also arranged in the first semiconductor area 2, and an adjoining drift zone which consists of the remaining part of the first epitaxial layer 261 and the substrate 27.

The length (lateral extent) of the lateral channel area 22 is typically between 1 µm and 5 µm with a semiconductor structure 100 produced from silicon carbide. The lateral channel area 22 is preferably constructed to be as short as possible. This results in a very contact overall structure with little space requirement. The vertical extent is typically between 0.5 µm and 2 µm without voltage and current applied. The depletion zones 23 and 24 are characterized by great depletion of charge carriers and thus exhibit a much higher electrical resistance than the lateral channel area 22 bounded by them in the vertical direction. The spatial extent of the two depletion zones 23 and 24, particularly that in the vertical direction, varies in dependence on the prevailing current and voltage conditions.

The lateral channel area 22 significantly determines the (control) behavior of the entire semiconductor structure 100. When it is constructed as a current limiter, the behavior in the presence of an operating voltage in the forward direction depends on the electrical current I flowing through the semiconductor structure 100 between the two electrodes 50 and 60. As the current intensity rises, the forward voltage drop between the electrodes 50 and 60 increases due to the path resistance. This leads to an increase in the depletion zones 23 and 24 and, in consequence, to a reduction in the current-carrying cross sectional area in the lateral channel area 22, which is associated with a corresponding increase in resistance. When a particular critical current value (saturation current) is reached, the two depletion zones 23 and 24 touch each other and completely pinch off the lateral channel area 22.

Such a channel pinch-off can also be achieved by applying a control voltage to a control electrode 40 which is in resistive contact with the second semiconductor area 4. The external control voltage can be used for influencing the end of the depletion zone 24 in the vertical direction and thus the current flow in the channel area 22.

The first depletion zone 24, which essentially effects the external controllable influencing of the channel area 22, can be basically produced in different ways within the first semiconductor area 2. Embodiments known from WO 00/16403 A1 comprise, for example, a Schottky contact or MOS (Metal Oxide Semiconductor) contact arranged on the first surface 20.

The switch element 110 itself exhibits a very high intrinsic reverse-voltage strength, especially when it is implemented in SiC. Due to the finite extent, however, an excessive increase of the electric field can occur at the periphery of the switch element 110, particularly on the first surface 20. Without any additional measure for reducing this critical surface field, the breakdown of the switch element 110, and thus its reverse-voltage strength, is not determined by the advantageous volume characteristic but by the edge situations. As a result, the reverse voltage strength of the entire semiconductor structure 100 is reduced.

To avoid this, the edge element 120 is arranged adjacently to the switch element 110. It contains a single-stage JTE edge termination in the form of a weakly p-type doped ($p^-$) edge termination area 32. In principle, a multi-stage embodiment described in EP 0 772 889 B1 is also possible.

The semiconductor structure 100 is also intended, in particular, to be used as high-voltage component in a cascode circuit. In this special circuit variant, the control electrode 40 is connected to one of the two main connections of the cascode circuit and thus also has applied to it the full reverse potential in the reverse-voltage case. It has been found that it is advantageous to connect the edge termination to the control electrode 40.

In this arrangement, however, an arrangement of the edge termination area 32 at the level of the second semiconductor area 4, not provided in FIG. 1, can still lead to an unwanted local increase in the field in the reverse-voltage case. The location of this local field spike is on the lateral edge of the buried island area 3 facing the edge element 120, particularly at the lower right-hand corner. The potential line is additionally curved at this point and thus the reverse voltage strength reduced. It has been found that the cause of the local field increase in the edge termination area 32 positioned at the first surface 20 and that an improvement can be achieved by lowering it.

Correspondingly, the edge termination area 32 in the example of FIG. 1 is not arranged at the level of the second semiconductor area 4 but at the level of the buried island area 3 on the second surface 80. The connection to the control electrode 40 is effected via a strongly p-type ($p^+$) buried edge area 31 which is constructed in accordance with the island area 3 of the switch element 110. At least a part of the surfaces of the edge area 31 and of the edge termination area 32 are exposed, for example by means of an etching process. The metallization of the control electrode 40 extends up to the edge area 31 in the recess 71 thus formed. In an alternative, not shown, the electrically conductive connection of the edge area 31 to the second semiconductor area 4 can also be effected only by a p-type connecting area 33. The control electrode 40 does not then extend up to the edge area 31.

Arranging island, edge and edge termination area 3, 31 and 32, respectively at the same level leads to a reduced curvature of potential lines and to a reduced critical field strength in the edge element 120 so that the semiconductor structure 100 exhibits a reverse-voltage strength increased by about 30% overall with otherwise identical doping and thickness.

An advantageous effect with regard to the least possible curvature of the potential lines in the edge element 120 is also if a distance d1 between the island area 3 and the edge area 31 is at the most equal to a distance d between the island areas 3 of adjacent switch elements 110 (d1 ≦d). Thus, if the semiconductor structure 100 is provided in a multi-cell structure with a multiplicity of switch elements 110 and with a uniform pitch, the distance d between the island areas 3 of adjacent switch elements 110 is, for example, uniformly in each case 5 µm. A typical value of the distance d1 to the edge element 120 is then about 3.5 µm. In this case, i.e. if d1 is smaller than d, the edge element 120 has a higher reverse-voltage strength than the switch element 110. In the case of a reverse voltage, any avalanche breakdown will then occur not in the edge element 120 but preferably homogeneously distributed in the volume of the switch elements 110 which, in particular, are present in large numbers. The avalanche current thus does not flow, or only flows to an insignificant extent, in the control circuit designed only for a low current flow. Instead, it largely flows via the two electrodes 50 and 60 (load circuit) which are designed for a high current value, in any case.

At the lateral edge 72 of the recess 71, a particularly very strongly p-type (p++) connecting area 33 is provided in order to avoid a leakage current between the cathode electrode 50 and the control electrode 40.

It establishes a p-type connection between the second semiconductor area 4 and the edge area 31. There are also other possibilities for avoiding the leakage current, for example an insulating oxide layer additionally arranged between the lateral edge 72 and the control electrode 40 or a special choice of contact material used for the control electrode 40 so that a resistive contact is formed on a p-type area and, on the other hand, a Schottky contact is formed on an n-type area.

Figure 2:
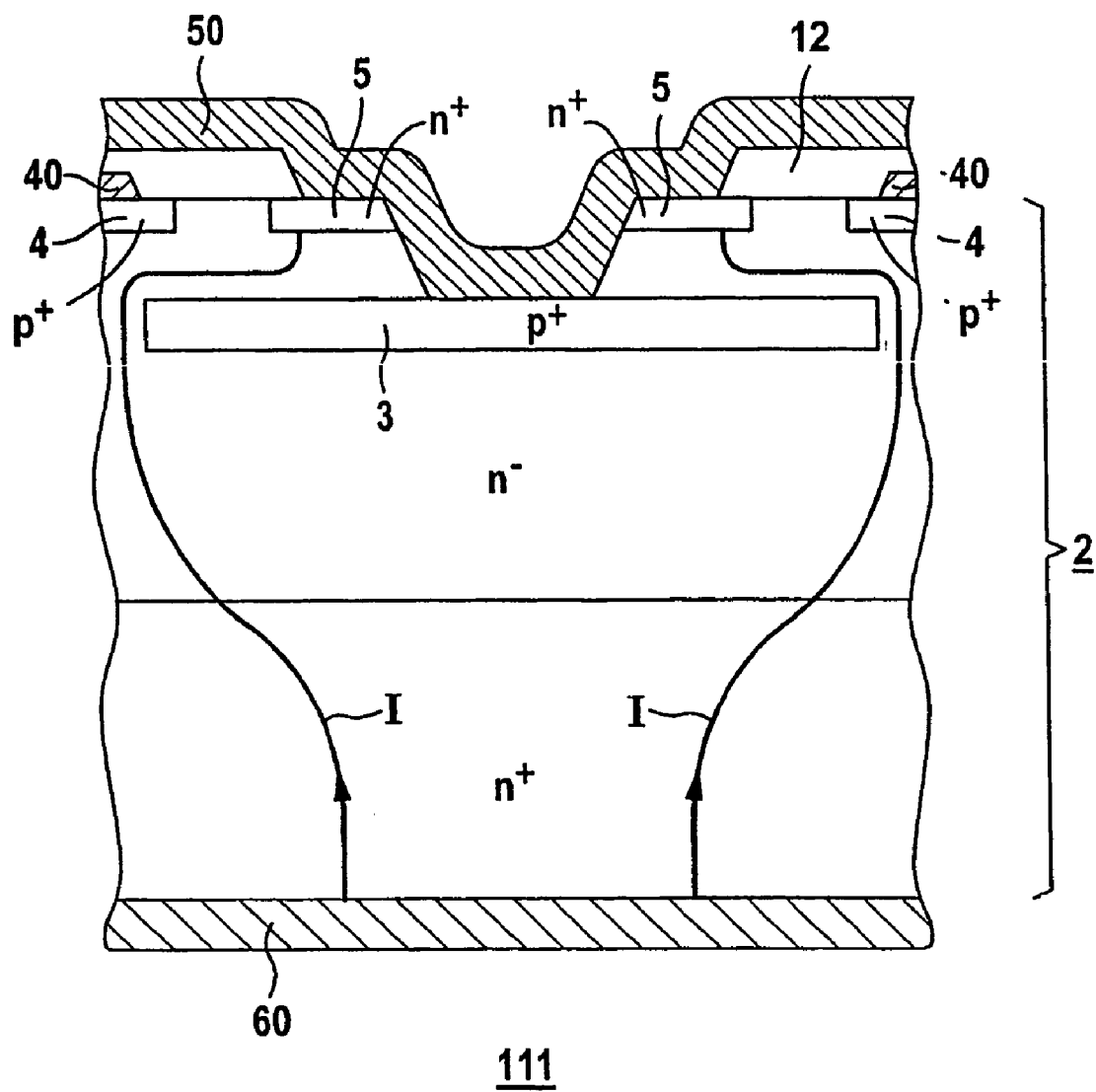
FIG. 2 is a partial section showing an alternative switch element.

A possible alternative to the switch element 110 shown in FIG. 1 is shown in FIG. 2 in the form of a switch element 111. The essential difference consists in that the cathode contact area 5 is not arranged within the buried island area 3 but on the first surface 20. However, this does not change anything in the basic operation described in conjunction with FIG. 1.

In addition, a possible arrangement of the cathode electrode 50 and of the control electrode 40 is shown, both of which are placed on the same side of the switch element 111. The cathode electrode 50, which is designed for a large current flow and thus with a larger area, is separated from the cathode electrode 50 which is designed for a low current flow and thus with a smaller area, by means of an insulation layer 12 consisting, in particular, of oxide.

Figure 3:
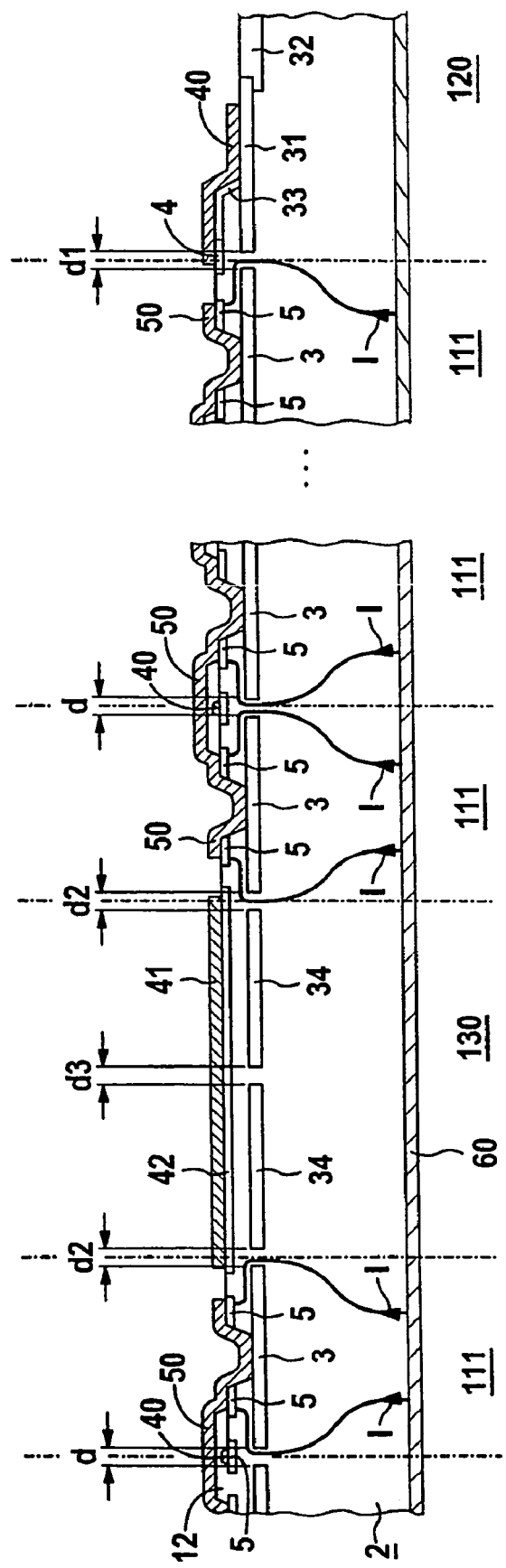
FIG. 3 is a diagrammatic side view of a semiconductor structure with a number of switch elements, one edge element and one control contact element.

FIG. 3 shows a semiconductor structure 200 in multi-cell structure with a multiplicity of parallel-connected switch elements 111 and with an edge element 120 and with a control contact element 130. The additionally provided control contact element 130 is used for connecting an external control feedline to the interconnected control electrodes 40 of the individual switch elements 111. In particular, it is possible to bond such a control feedline on in this area.

The control contact element 130 arranged between two switch elements 111, for example in the center of the semiconductor structure 200, contains a strongly p-type ($p^+$) control contact area 42 which is resistively contacted by means of a control electrode connection 41. The control contact area 42 and the control electrode connection 41 are conductively connected to the respective second semiconductor areas 4 and the respective control electrodes 40, respectively, of the individual switch elements 111.

To avoid field increases also in the area of the control contact element 130, a number of strongly p-type ($p^+$) buried island areas 34 are provided in the control contact element 130 at the same level as the buried island areas 3 of the switch elements 111. The island areas 34 of the control contact element 130 are not conductively connected to the island areas 3 of the switch elements 111. Instead, they are floating. Nevertheless, they, too, effect the advantageous homogenization of the field lines, i.e. they reduce the curvatures of the potential lines otherwise present. It is also advantageous in this case if the distances d2 between the island areas 34 among each other and the distances d3 to the island areas 3 of the adjacent switch elements 111 are as uniform as possible and in each case at a maximum of the same magnitude as the uniform distance d of the island areas 3 among each other. For example, d2 and d3 can also be equal to d. This means that the pitch of the multi-cell structure is also maintained in the area of the control contact element 130.

Figure 4:
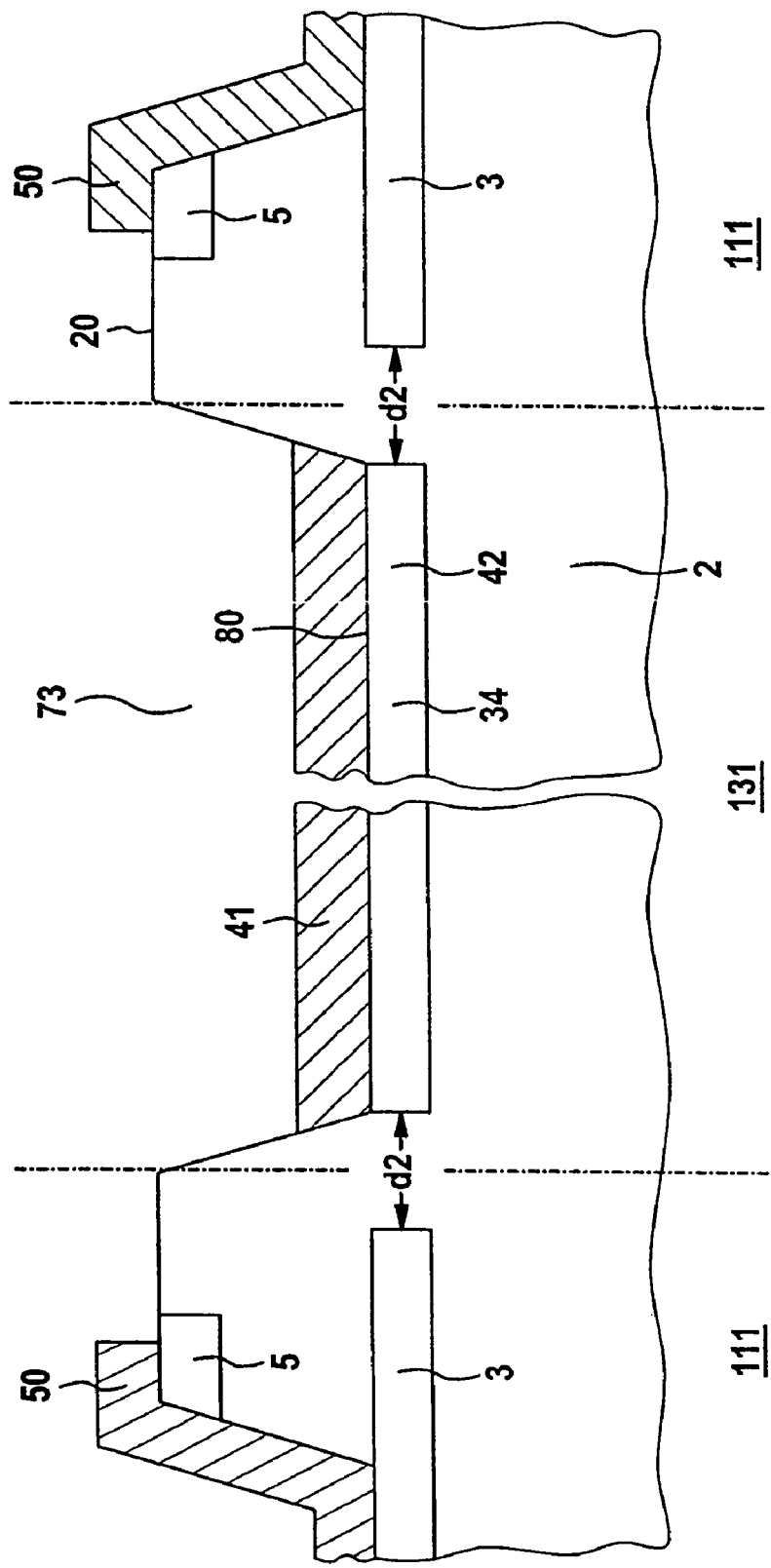
FIG. 4 is a diagrammatic view of an alternative control contact element.

FIG. 4 shows a semiconductor structure 300 with an alternative embodiment of a control contact element 131 in which the buried island areas 34 and the control contact area 42 coincide to form a single area. The control contact area 42 is then at the level of the island areas 3 of the switch elements 111 and is again preferably arranged at the uniform distance d to the island areas 3 of the adjacent switch elements 111. Contacting by means of the control electrode connection 41 occurs in a recess 73 extending up to the second surface 80. Thus, a lowered control electrode contacting with, at the same time field-homogenizing effect is provided.

Naturally, the types of conduction provided in the respective semiconductor areas in the semiconductor structures 100, 200 and 300 can also assume the in each case opposite conductivity type in alternative embodiments.

We claim:
1. A semiconductor structure for controlling and switching a current, comprising:
 a) a switch element with:
  a1) a first semiconductor area of a first conductivity type defining therein a path for the current, an anode electrode and a cathode electrode in contact with said first semiconductor area;
  a2) a first depletion zone formed at least partially within said first semiconductor area, and a control electrode disposed to influence said first depletion zone by way of a control voltage for the purpose of controlling the current; and
  a3) an island area of a second conductivity type opposite the first conductivity type, said island area being at least partially buried within said first semiconductor area and contacted by way of said cathode electrode;
 b) an edge element with:
  b1) an edge area of the second conductivity type buried at least partially within said first semiconductor area and disposed substantially at a same level as said buried island area; and
  b2) an edge termination area of the second conductivity type, adjoining said edge area; and
  b3) an electrically conductive connection between said control electrode and said edge area.
2. The semiconductor structure according to claim 1, which comprises a channel area disposed within said first semiconductor area, wherein the path for the current extends through said channel area and the current within said channel area can be influenced by way of said first depletion zone.
3. The semiconductor structure according to claim 1, wherein said first depletion zone is formed by a p-n junction between said first semiconductor area and a second semiconductor area of the second conductivity type disposed on a surface within said first semiconductor area.
4. The semiconductor structure according to claim 1, wherein said first depletion zone is disposed above said buried island area.
5. The semiconductor structure according to claim 1, wherein said switch element is one of a multiplicity of mutually adjacent switch elements.
6. The semiconductor structure according to claim 5, wherein spacing distances between the respective said buried island areas of said adjacent switch elements are of equal magnitude.
7. The semiconductor structure according to claim 5, wherein a distance between said buried island area of said switch element adjoining said edge element and said buried edge area is at a maximum equal to the magnitude of a spacing distance between said buried island areas of said adjacent switch elements.
8. The semiconductor structure according to claim 5, which further comprises a control contact element disposed to control said switch element.
9. The semiconductor structure according to claim 5, wherein said control contact element is disposed between two said switch elements.
10. The semiconductor structure according to claim 9, wherein said control contact element contains at least one buried island area of the second conductivity type.
11. The semiconductor structure according to claim 10, wherein said at least one buried island area of said control contact element is disposed at a common level with said buried island area of said switch element.

12. The semiconductor structure according to claim 10, wherein a spacing distance between said buried island area of said switch element adjoining said control contact element and a buried island area of said control contact element is no more than a magnitude as the spacing distances between said buried island areas of adjacent said switch elements.

13. The semiconductor structure according to claim 10, wherein said control contact element contains a control contact area of the second conductivity type.

14. The semiconductor structure according to claim 11, wherein said control contact area and said buried island area of said control contact element coincide.

15. The semiconductor structure according to claim 1, wherein a recess is formed for contacting said buried edge area by way of said control electrode.

16. The semiconductor structure according to claim 15, wherein said recess has a lateral edge, and an insulation is disposed at said lateral edge of said recess.

17. The semiconductor structure according to claim 16, wherein a connecting area of the second conductivity type is provided at said lateral edge of said recess within said first semiconductor area.

18. The semiconductor structure according to claim 15, wherein a connecting area of the second conductivity type is provided at a lateral edge of said recess within said first semiconductor area.

19. The semiconductor structure according to claim 1, wherein the semiconductor material is silicon carbide.

* * * * *